United States Patent
Kim et al.

(10) Patent No.: US 8,228,711 B2
(45) Date of Patent: Jul. 24, 2012

(54) BI-DIRECTIONAL RESISTIVE MEMORY DEVICES AND RELATED MEMORY SYSTEMS AND METHODS OF WRITING DATA

(75) Inventors: Ho-Jung Kim, Gyeonggi-do (KR); Chul-Woo Park, Gyeonggi-do (KR); Sang-Beom Kang, Gyeonggi-do (KR); Hyun-Ho Choi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 269 days.

(21) Appl. No.: 12/715,742

(22) Filed: Mar. 2, 2010

(65) Prior Publication Data
US 2010/0220513 A1 Sep. 2, 2010

(30) Foreign Application Priority Data
Mar. 2, 2009 (KR) .................. 10-2009-0017686

(51) Int. Cl.
*G11C 11/00* (2006.01)
(52) U.S. Cl. ............... 365/148; 365/163; 365/189.05
(58) Field of Classification Search .............. 365/148, 365/163, 189.05, 189.07, 189.09, 194, 205
See application file for complete search history.

(56) References Cited

U.S. PATENT DOCUMENTS

| 6,021,083 | A | 2/2000 | Shiau et al. |
| 6,252,795 | B1 * | 6/2001 | Hansen et al. ............. 365/158 |
| 6,272,040 | B1 * | 8/2001 | Salter et al. .............. 365/158 |
| 7,154,774 | B2 * | 12/2006 | Bedeschi et al. ........... 365/163 |
| 7,388,775 | B2 * | 6/2008 | Bedeschi et al. ........... 365/163 |
| 2007/0019465 | A1 * | 1/2007 | Bedeschi et al. ........... 365/163 |
| 2007/0109840 | A1 | 5/2007 | Gogi |

FOREIGN PATENT DOCUMENTS
KR 10-0558548 3/2006
* cited by examiner

*Primary Examiner* — Gene Auduong
(74) *Attorney, Agent, or Firm* — Myers Bigel Sibley & Sajovec

(57) ABSTRACT

A bi-directional resistive memory device includes a memory cell array including a plurality of memory cells and an input/output (I/O) circuit. The I/O circuit is configured to generate a first voltage having a positive polarity and a second voltage having a negative polarity, provide one of the first voltage and the second voltage to the memory cell array through a bitline responsive to a logic state of input data, and adjust magnitudes of the first and second voltage when data written in the memory cell array has an offset. Related memory systems and methods are also provided.

18 Claims, 13 Drawing Sheets

US 8,228,711 B2

BI-DIRECTIONAL RESISTIVE MEMORY DEVICES AND RELATED MEMORY SYSTEMS AND METHODS OF WRITING DATA

CLAIM OF PRIORITY

This application claims priority to Korean Patent Application No. 2009-0017686, filed Mar. 2, 2009, the content of which is hereby incorporated herein by reference as if set forth in its entirety.

FIELD OF THE INVENTION

This invention relates to memory devices and, more particularly, to bi-directional resistive memory devices, memory systems including bi-directional resistive memory devices, and methods of inputting data of bi-directional resistive memory devices.

BACKGROUND

Semiconductor memory devices for storing data may be classified into two groups, volatile memory devices and non-volatile memory devices. The volatile memory devices are typically configured to store data by charging or discharging capacitors in memory cells, and widely used as main memories of various apparatuses. The volatile memory devices such as Dynamic Random Access Memory (DRAM) and Static Random Access Memory (SRAM) retain stored data while power is supplied and lose the stored data when power is off. The volatile memory devices are used as a main memory device in various apparatuses, such as computers.

The non-volatile memory devices, such as flash memory devices, may maintain stored data even though power is off, and widely used for storing program codes and/or data in computers, mobile devices, etc.

According to demands for high memory capacity, high operation speed and low power consumption of the memory devices, new memory devices of various types have been developed to realize high integration rate of DRAM, high speed of SRAM and non-volatility of flash memory in a single memory device. For example, Phase Change Random Access Memory (PRAM) that use phase change materials, Resistance Random Access Memory (RRAM) that use materials having variable resistance such as transition-metal oxides, and Magnetic Random Access Memory (MRAM) that use ferromagnetism materials are attracting attention as memory devices of the next generation. Such materials have common characteristics that resistance thereof is variable depending on magnitude and/or direction of applied voltage and/or current, and that the resistance can be maintained (that is, non-volatility) even though the applied voltage and/or current is intercepted and thus refresh operation is not required.

Each memory cell of the resistive memory devices may be formed with one resistive element and one switching element so that data may be stored by controlling voltage and/or current of a bitline and a wordline to change resistance of the resistive element.

The resistive memory cells may be classified into PRAM, RRAM, MRAM, etc. depending on materials forming the resistive element of the memory cell. For example, the resistive element of PRAM may include phase change materials such as Ge—Sb—Te, resistance of which is varied depending on temperature, the resistive element of RRAM may include a top electrode, a bottom electrode and transition-metal oxides between the top and bottom electrodes, and the resistive element of MRAM may include a magnetic top electrode, a magnetic bottom electrode and dielectric materials between the top and bottom electrodes.

The resistive memory device may be classified into a uni-directional resistive memory device, in which resistance of the resistive element changes according to magnitude of voltage and/or current of a bitline and a wordline, and a bi-directional resistive memory device, in which resistance of the resistive element changes according to magnitude and direction of voltage and/or current of a bitline and a wordline.

SUMMARY

Some embodiments provide a bi-directional resistive memory device including a memory cell array including a plurality of memory cells and an input/output (I/O) circuit. The I/O circuit is configured to generate a first voltage having a positive polarity and a second voltage having a negative polarity, provide one of the first voltage and the second voltage to the memory cell array through a bitline responsive to a logic state of input data, and adjust magnitudes of the first and second voltage when write data written in the memory cell array has an offset.

In further embodiments, sources of the plurality of memory cells may be commonly coupled to a common source line and a reference voltage having a single voltage level may be applied to the common source line.

In still further embodiments, a ground voltage may be applied to the common source line.

In some embodiments, each of the plurality of memory cells may include a variable resistive element, and the variable resistive element may be a bipolar element which has a conducting current and a corresponding resistance when a voltage applied to two terminals of the variable resistive element has a positive polarity and a negative polarity.

In further embodiments, the variable resistive element may include a first element including non-ohmic material and a second element including resistive material connected in series. In certain embodiments, the resistive material may include one of phase change material, transition-metal oxide and ferromagnetism material.

In still further embodiments, the I/O circuit may include an input circuit and an output circuit. The input circuit may be configured to provide the first voltage or the second voltage to selected bitline coupled to the memory cell array in a write operation mode, and may be configured to adjust the magnitudes of the first and second voltage when the write data has an offset. The output circuit may be configured to sense data stored in the memory cell array through the selected bitline, latch the sensed data and output the latched data in a verification read operation mode, or a read operation mode.

In some embodiments, the input circuit may include a first voltage generating circuit, a second voltage generating circuit and a write driving circuit. The first voltage generating circuit may be configured to generate the first voltage responsive to a first voltage control signal. The second voltage generating circuit may be configured to generate the second voltage in response to a second voltage control signal. The write driving circuit may be configured to receive the input data, select one of the first voltage corresponding to a first data of the input data and the second voltage corresponding to a second data of the input data, and provide the selected one to the memory cell array through the bitline BL in a write operation mode.

In further embodiments, the input circuit may further include a first register configured to output the first voltage control signal and a second register configured to output the second voltage control signal.

In still further embodiments, the first and second voltages may be generated based on verification read operation when the write data has an offset.

In some embodiments, the write driving circuit may include an input buffer configured to latch and buffer the input data and a driving unit configured to output one of the first and second voltages to the bitline through selection transistors in response to an output signal of the input buffer.

In further embodiments, the first voltage generating circuit may include a resistance adjusting unit, a comparator, a clock generator and a pumping circuit. The resistance adjusting unit may be connected between first and second nodes and may be configured to adjust the first voltage on the first node in response to the first voltage control signal. The comparator may have a first input terminal connected to the second node and a second input terminal configured to receive a reference voltage, and output a feedback voltage. The clock generator may be configured to generate first and second clock signals whose phase difference is substantially 180° responsive to the feedback voltage. The pumping circuit may be configured to perform a pumping operation, generate the first voltage and provide the first voltage to the first node, in response to the first and second clock signals.

In still further embodiments, the resistance adjusting unit may adjust the magnitude of the first voltage on the first node by varying resistance in response to the first voltage control signal.

In some embodiments, the second voltage generating circuit may include a resistance adjusting unit, a comparator, a clock generator and a pumping circuit. The resistance adjusting unit may be connected between first and second nodes and may adjust the second voltage on the first node in response to the second voltage control signal. The comparator may have a first input terminal connected to the second node and a second input terminal receiving a reference voltage, and output a feedback voltage. The clock generator may generate first and second clock signals whose phase difference is substantially 180° in response to the feedback voltage. The pumping circuit may perform pumping operation, generate the second voltage and provide the second voltage to the first node, in response to the first and second clock signals.

In further embodiments, the bi-directional resistive memory device may further include a negative bias voltage generating circuit that generates a negative bias voltage and provides the negative bias voltage as a bias for the I/O circuit.

Still further embodiments provide a memory system including a memory controller and a bi-directional resistive memory device. The memory controller generates an address signal and command signals. The bi-directional resistive memory device stores data and outputs the stored data based on the address signal and command signals. The bi-directional resistive memory device includes a memory cell array including a plurality of memory cells and an input/output (I/O) circuit. The I/O circuit generates a first voltage having a positive polarity and a second voltage having a negative polarity, provides one of the first voltage and the second voltage to the memory cell array through a bitline in response to a logic state of input data, and adjusts magnitudes of the first and second voltage when data written in the memory cell array (write data) has an offset.

Some embodiments provide a method of writing data in a bi-directional resistive memory device including an input/output (I/O) circuit and a memory cell array. In some embodiments, (a) input data is loaded to the I/O circuit; (b) the input data is written in the memory cell array; (c) a verification read operation on the data (write data) written in the memory cell array is performed in the I/O circuit; (d) whether the input data matches with the write data based on result of the verification read operation is determined in the I/O circuit; (e) writing input data is finished when the input data matches with the write data in the I/O circuit; (f) magnitudes of first and second voltages are increased while writing input data in the memory cell array in the I/O circuit when the input data does not with the write data.

In further embodiments, steps (c) to (e) may be repeatedly performed until the input data matches with the write data when the input data does not with the write data.

DETAILED DESCRIPTION OF THE EMBODIMENTS

Figure 1:
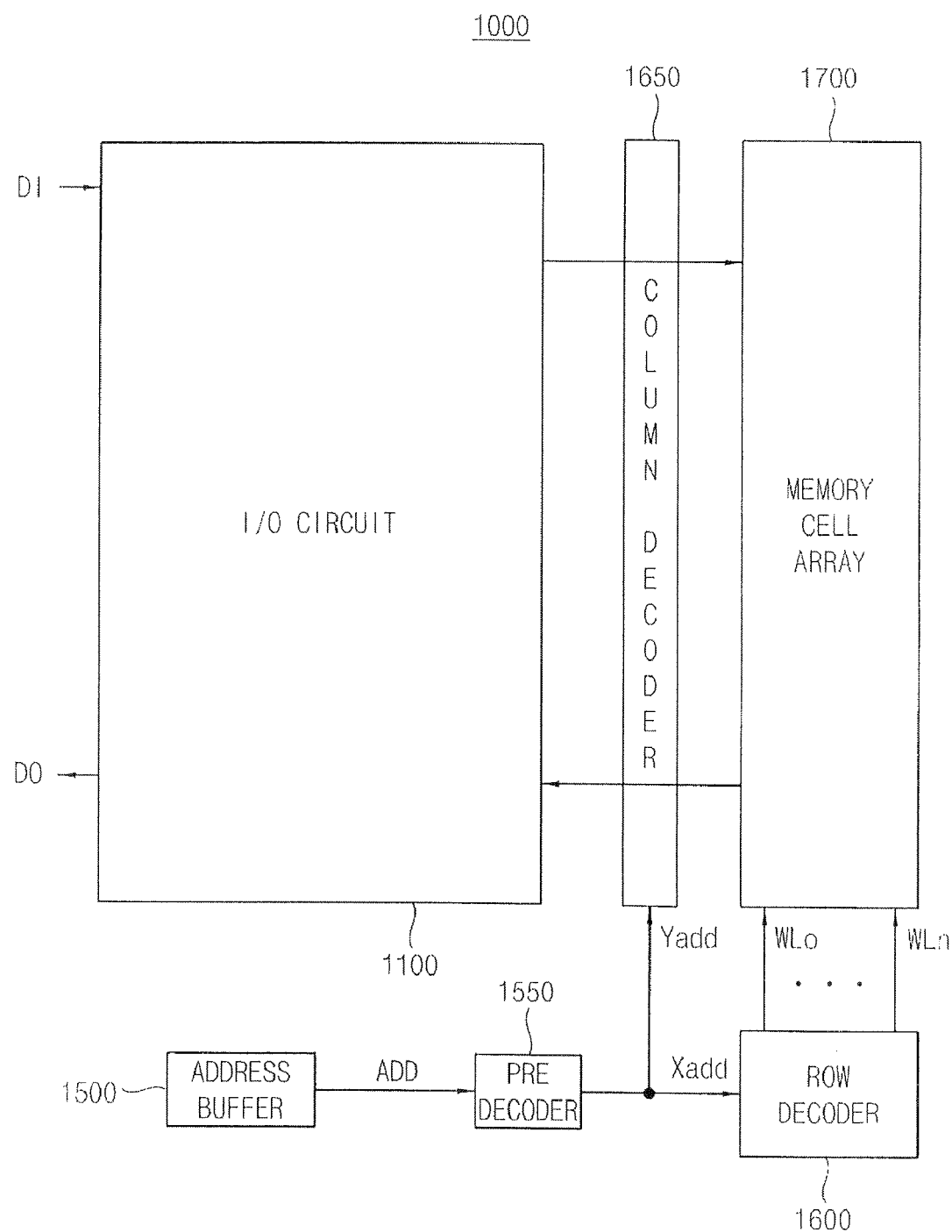
FIG. 1 is a block diagram illustrating a bi-directional memory device according to some embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Referring first to FIG. 1, a block diagram illustrating a bi-directional memory device according to some embodiments will be discussed. As illustrated in FIG. 1, a bi-directional memory device 1000 includes an input/output (I/O) circuit 1100 and a resistive memory cell array (or memory cell array) 1700. The resistive memory cell array 1700 includes a plurality of memory cells, and each of memory cells is coupled to a corresponding bitline.

The I/O circuit 1100 generates a first voltage having a positive polarity and a second voltage having a negative polarity. The I/O circuit 1100 selects and provides one of the first voltage and the second voltage to the resistive memory cell array 1700 according to logic level of input data DI. In addition, the I/O circuit 1100 adjusts magnitudes of the first and second voltage when write data in the resistive memory cell array 1700 has an offset. In addition, the I/O circuit 1100 outputs data stored in the resistive memory cell array 1700. Unlike a resistive memory cell array of a uni-directional resistive memory device, voltage applied to two end terminals of each of memory cells included in the resistive memory cell array 1700 may have a different polarity depending on logic level of input data.

The bi-directional memory device 1000 may further include an address buffer 1500, a pre-decoder 1550, a row decoder 1600 and a column decoder 1650. The pre-decoder 1550 generates a row address Xadd and a column address Yadd based on an address signal ADD from the address buffer 1500. The row decoder 1600 generates wordline driving signals WL0 through WLn based on the row address Xadd for selecting a row of memory cells in the resistive memory cell array 1700. The column decoder 1650 decodes column address Yadd and designates a bitline coupled to the memory cell, for performing the write operation or the read operation.

Figure 2:
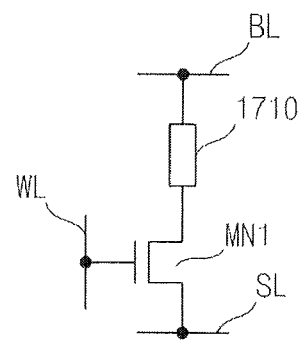
FIG. 2 is a diagram illustrating an example of a memory cell of the memory cell array in FIG. 1.

Referring now to FIG. 2, a diagram illustrating an example of a memory cell of the memory cell array in FIG. 1 will be discussed. As illustrated in FIG. 2, a memory cell may include a variable resistive element 1710 and a bitline BL, and an n-type metal oxide semiconductor (NMOS) transistor MN1 serially coupled between a bitline BL and a source line SL. The gate of the NMOS transistor MN1 is connected to a wordline WL. The variable resistive element 1710 has a variable resistance.

Figure 3:
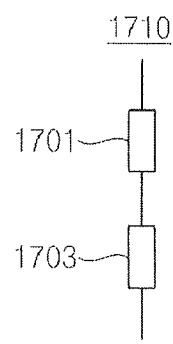
FIG. 3 is a diagram illustrating an example of a variable resistive element in the memory cell of FIG. 2.

Referring now to FIG. 3, a diagram illustrating an example of a variable resistive element in the memory cell of FIG. 2 will be discussed. As illustrated in FIG. 3, a variable resistive element 1710 a first element 1701 formed with non-ohmic material and a second element 1703 formed with resistive material are connected in series. The first element 1701 formed with non-ohmic material has a high resistance within a predetermined range of voltage, and a low resistance out of the predetermined range of voltage. Therefore, the variable resistive element 1710 is a bipolar element which has a conducting current and a corresponding resistance when a voltage applied to two terminals of the variable resistive element 1710 has a positive polarity and a negative polarity. Accordingly, the variable resistive element 1710 may be set to have data "1" when a voltage applied to the bitline BL (bitline voltage) connected to the variable resistive element 1710 has a positive polarity, and the variable resistive element 1710 may be set to have data "1" when the bitline voltage has a negative polarity.

Figure 4:
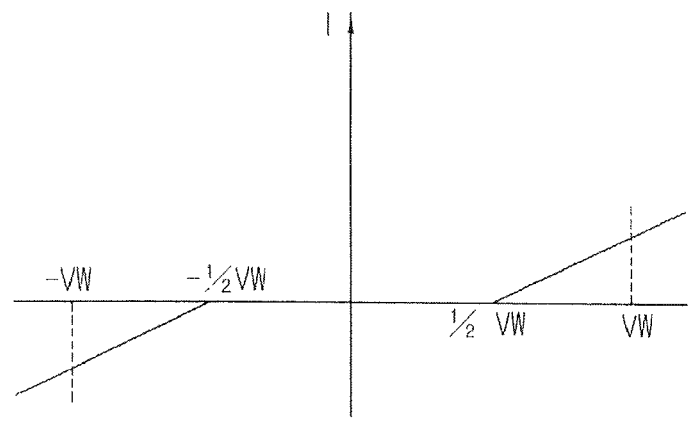
FIG. 4 is a diagram illustrating a characteristic of the variable resistive element of FIG. 3.

Referring now to FIG. 4, a diagram illustrating a characteristic of the variable resistive element of FIG. 3 will be discussed. As illustrated in FIG. 3, current does not conduct through the variable resistive element 1710 when the a voltage applied to two terminals of the variable resistive element 1710 (terminal voltage) is within a predetermined range (−VW/2~VW/2) and the current conducts through variable resistive element 1710 when the terminal voltage is outside the predetermined range (−VW/2~VW/2). VW denotes write voltage. For example, VW may correspond to data "1", and −VW may correspond to data "0".

Figure 5A:
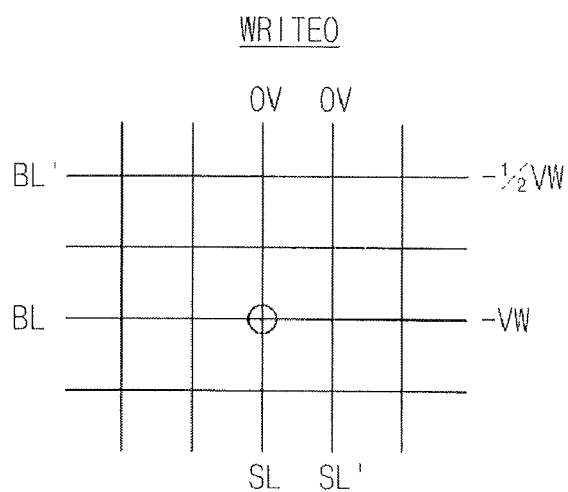
FIGS. 5A and 5B are diagrams illustrating examples of voltages applied to the bitline and the source line when data is written to the memory cell array in accordance with some embodiments.
Figure 5B:
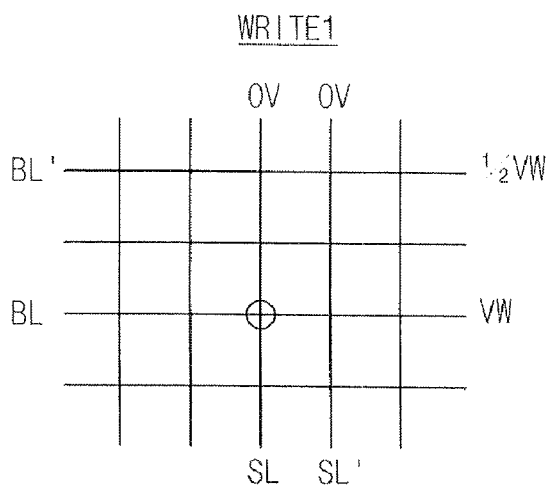

Referring now to FIGS. 5A and 5B, diagrams illustrating examples of voltages applied to the bitline and the source line when data is written to the memory cell array 1700 will be discussed. As illustrated in FIG. 5A, a diagram illustrates an example of voltages applied to the bitline BL and the source line SL when data "0" is written to the memory cell array 1700. FIG. 5B is a diagram illustrating an example of voltages applied to the bitline BL and the source line SL when data "1" is written to the memory cell array 1700.

Referring to FIG. 5A, when data "0" is written to the memory cell array 1700, a bitline voltage having a magnitude −VW is applied to a selected bitline BL and a source line voltage having zero magnitude is applied to a selected source line SL. In addition, a bitline voltage having a magnitude −1.2VW is applied to an unselected bitline BL', and a source line voltage also having zero magnitude is applied to an unselected source line SL'. In addition, a voltage having a magnitude greater than the magnitude −VW may be applied to the unselected bitline BL' when data "0" is written to the memory cell array 1700.

Referring to FIG. 5B, when data "1" is written to the memory cell array 1700, a bitline voltage having a magnitude VW is applied to a selected bitline BL and a source line voltage having zero magnitude is applied to a selected source line SL. In addition, a bitline voltage having a magnitude 1.2VW is applied to an unselected bitline BL', and a source line voltage also having zero magnitude is applied to an unselected source line SL'. In addition, a voltage having a magnitude smaller than the magnitude VW may be applied to the unselected bitline BL' when data "0" is written to the memory cell array 1700.

Figure 6:
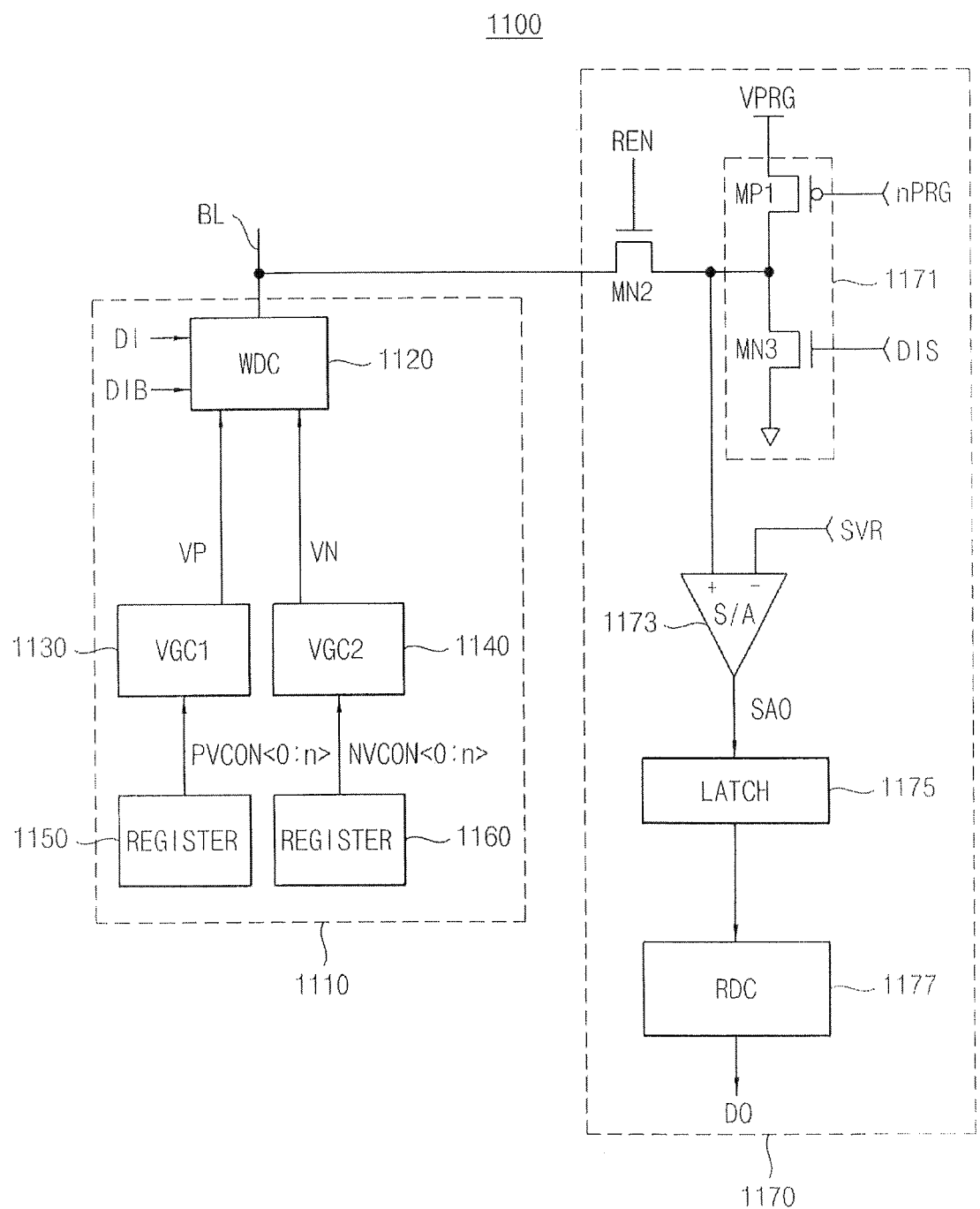
FIG. 6 is a circuit diagram illustrating an example of an I/O circuit in the bi-directional resistive memory device of FIG. 1.

Referring now to FIG. 6, a circuit diagram illustrating an example of an I/O circuit in the bi-directional resistive memory device of FIG. 1 will be discussed. As illustrated in FIG. 6, an I/O circuit 1100 includes an input circuit 1110 and an output circuit 1170.

The input circuit 1110 provides a first voltage VP or a second voltage VN, corresponding to input data DI, DIB respectively, to a selected bitline BL coupled to the memory cell array 1700 in a write operation mode, and the input circuit 1110 adjusts magnitudes (or levels) of the first voltage VP and the second voltage VN when data written to the memory cell array 1700 has an offset. The output circuit 1170 senses data stored in the memory cell array 1700, latches the sensed data and outputs the latched data in a verification read operation mode, or a read operation mode. The first voltage VP may have a positive polarity and the second voltage VN may have a negative polarity.

The input circuit 1110 includes a write driving circuit (WDC) 1120, a first voltage generating circuit (VGC1) 1130, a second voltage generating circuit (VGC2) 1140, a first register 1150, and a second register 1160.

The first register 1150 provides a first voltage control signal PVCON<0:n> and the second register 1160 provides a second voltage control signal NVCON<0:n>. The first voltage generating circuit 1130 performs pumping operation and generates the first voltage VP in response to the first voltage control signal PVCON<0:n>. The second voltage generating circuit 1140 performs pumping operation and generates the second voltage VN in response to the second voltage control signal NVCON<0:n>.

The write driving circuit 1120 receives the input data DI and DIB, selects one of the first voltage VP corresponding the input data DI and the second voltage VN corresponding the input data DIB, and provides the selected one to the memory cell array 1700 through the bitline BL.

The output circuit 1170 includes a NMOS transistor MN2, a bitline precharge circuit 1171, a sense amplifier 1173, a first latch circuit 1175 and a read driving circuit (RDC) 1177.

The NMOS transistor MN2 connects the bitline precharge circuit 1171 to the bitline BL in response to a read enable signal REN. A first terminal of the NMOS transistor MN2 is coupled to the bitline BL and a second terminal of the NMOS transistor MN2 is coupled to the bitline precharge circuit 1171. The bitline precharge circuit 1171 precharges the bitline BL in response to a precharge control signal nPRG and discharges the bitline BL in response to a discharge control signal DIS while the read enable signal REN is activated. The sense amplifier 1173 compares the bitline voltage provided through the NMOS transistor MN2 with a sensing reference voltage SVR to generate the sensing output signal SAO. The first latch circuit 1175 latches the sensing output signal SAO. The read driving circuit 1177 outputs the output data DO based on an output signal of the first latch circuit 1175.

The bitline precharge circuit 1171 may include a p-channel metal-oxide semiconductor (PMOS) transistor MP1 and an NMOS transistor MN3. The PMOS transistor MP1 has a source receiving a precharge voltage VPRG, a gate receiving the precharge control signal nPRG, and a drain coupled to the NMOS transistor MN3. The NMOS transistor MN3 has a source coupled to ground, a gate receiving the discharge control signal DIS, and a drain coupled to the PMOS transistor MP1.

When the write data has an offset according to performance of the verification read operation, the result of the verification read operation is stored in the first register 1150 and the second register 1160. The first and second registers 1150 and 1160 respectively output the first voltage control signal PVCON<0:n> and the second voltage control signal NVCON<0:n> based on the result of the verification read operation. The I/O circuit 1100 performs offset adjusting operation by increasing the first voltage control signal PVCON<0:n> and the second voltage control signal NVCON<0:n> until the write data matches with verification read data.

Figure 7:
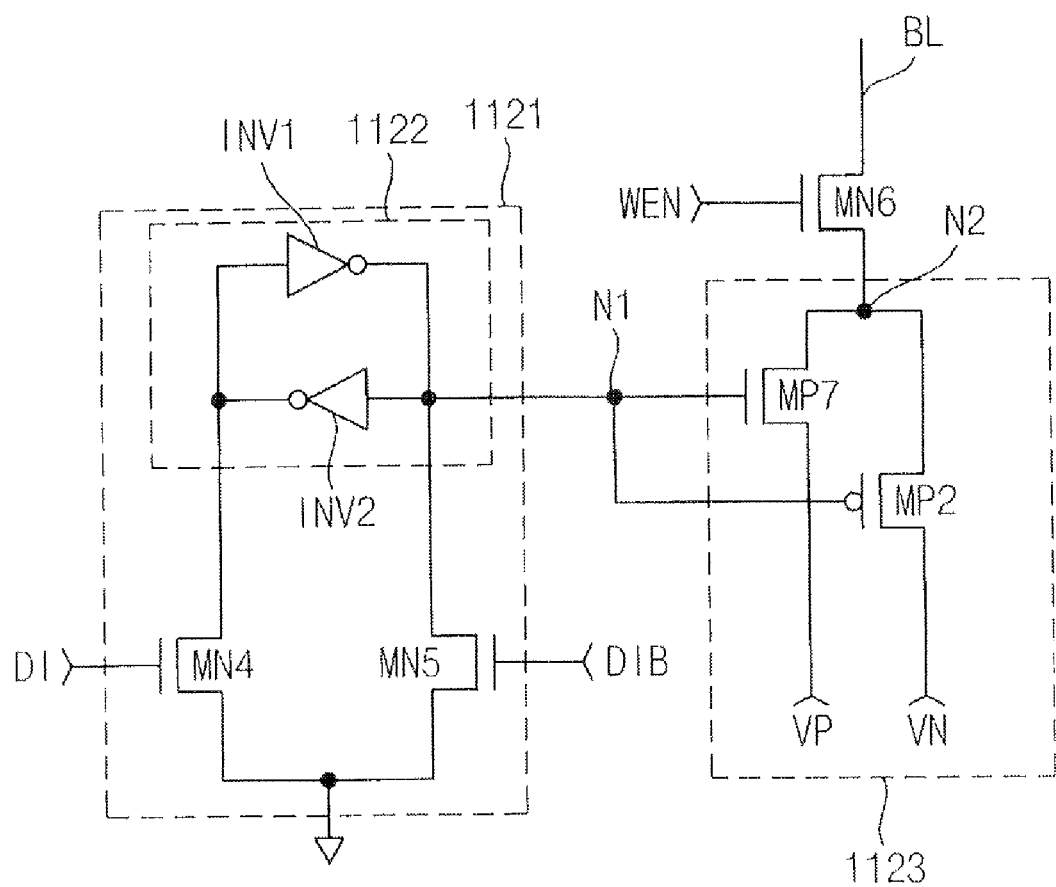
FIG. 7 is a circuit diagram illustrating an example of a write driving circuit in the I/O circuit of FIG. 6.

Referring now to FIG. 7, a circuit diagram illustrating an example of a write driving circuit 1120 in the I/O circuit 1110 of FIG. 6 will be discussed. As illustrated in FIG. 7, a write driving circuit 1120 includes a selection transistor MN6, an input buffer 1121, and a driving unit 1123.

The input buffer 1221 includes NMOS transistors MN4 and MN5 and a second latch circuit 1122. The second latch circuit 1122 includes inverters INV1 and INV2, and has a first terminal coupled to a node N1.

The NMOS transistor MN4 has a drain coupled to a second terminal of the second latch circuit 1122, a source coupled to the ground and a gate receiving the input data DI. The MNOS transistor MN5 has a drain coupled to the first terminal of the second latch circuit 1122, a source coupled to the ground and a gate receiving the inverting input data DIB.

The driving unit 1123 includes PMOS transistors MP2 and MP7. The PMOS transistor has a source coupled to a node N2, a gate coupled to the node N1 and a drain receiving the second voltage VN. The PMOS transistor MP7 has a source coupled to the node N2, a gate coupled to the node N1 and a drain receiving the first voltage VP.

The selection transistor MN6 electrically connects the bitline BL to the node N2 in response to a write enable signal WEN. The input buffer 1221 latches and buffers the input data DI and DIB. The driving unit 1123 outputs one of the first and second voltages VP and VN to the node N2 in response to an output signal of the input buffer 1221. One of the first and second voltages VP and VN is provided to the memory cell array 1700 through the bitline BL when the write enable signal WEN in enabled state.

Figure 8:
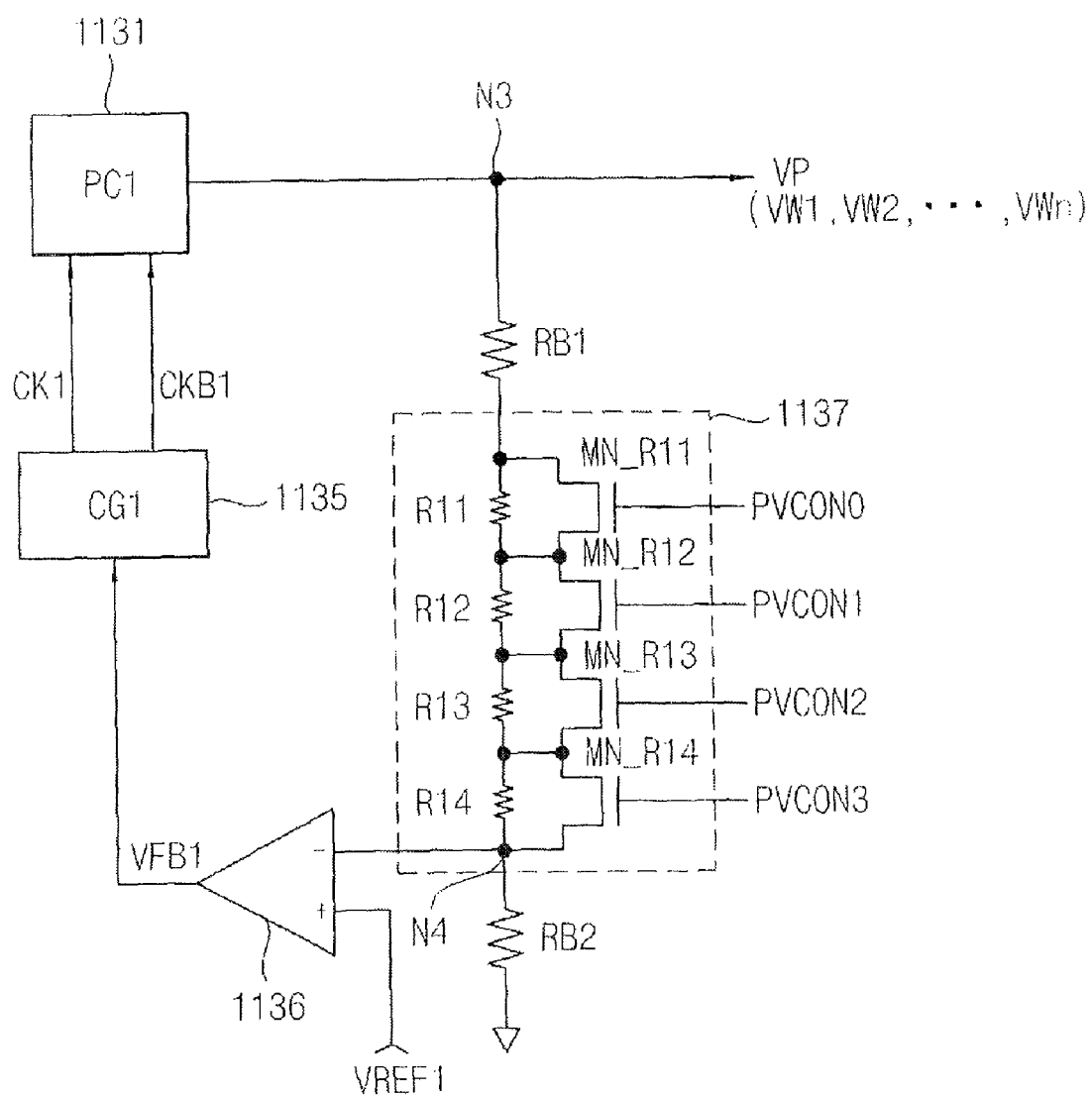
FIG. 8 is a circuit diagram illustrating an example of a first voltage generating circuit 1130 in the I/O circuit of FIG. 6.

Referring now to FIG. 8, a circuit diagram illustrating an example of a first voltage generating circuit 1130 in the I/O circuit 1110 of FIG. 6 will be discussed. As illustrated in FIG. 8, a first voltage generating circuit 1130 includes a first pumping circuit (PC1) 1131, a first clock generator (CG1) 1135, a first comparator 1136, reference resistors RB1 and RB2, a first resistance adjusting unit 1137. The first resistance adjusting unit 1137 includes resistors R11, R12, R13, and R14 and NMOS transistors MN11, MN12, MN13, and MN14. Each of the NMOS transistors MN11, MN12, MN13, and MN14 is connected in parallel to each of the resistors R11, R12, R13, and R14.

The reference resistor RB1 has a first terminal coupled to a node N3. The first resistance adjusting unit 1137 is connected between a second terminal of the resistor RB1 and a node N4, the reference resistor RB2 is connected between the node N4 and the ground.

The first comparator 1136 has a first (inverting) input terminal connected to the node N4 and a second (non-inverting) input terminal receiving a first reference voltage VREF1, and outputs a first feedback voltage VFB1. The first clock generator 1135 generates clock signals CK1 and CKB1 in response to the first feedback voltage VFB1. The phase difference of the clock signals CK1 and CKB1 is substantially 180°. The first pumping circuit 1131 performs a pumping operation in response to the clock signals CK1 and CKB1, generates the first voltage VP and provides the first voltage VP to the node N3. The first resistance adjusting unit 1137 adjusts resistance and the magnitude of the first voltage VP in response to the first voltage control signal (PVCON0~PVCON3).

Operation of the first voltage generating circuit of FIG. 8 will now be discussed. The first feedback voltage VFB1, output of the first comparator 1136, becomes logic high, when the magnitude of the first voltage VP on the node N3 decreases. The first clock generator 1135 generates the clock signals CK1 and CKB1 in response to the first feedback voltage VFB1, and provides the clock signals CK1 and CKB1 to the first pumping circuit 1131. The first pumping circuit 1131 performs pumping operation in response to the clock signals CK1 and CKB1, and increases the magnitude of the first voltage VP.

The first feedback voltage VFB1, output of the first comparator 1136, becomes logic low, when the magnitude of the first voltage VP on the node N3 increases. The first clock generator 1135 disables clock signals CK1 and CKB1 in response to the first feedback voltage VFB1. Therefore, the magnitude of the first voltage VP does not increase because the first pumping circuit 1131 does not perform pumping operation.

When the write data has offsets, the magnitude of the first voltage VP is adjusted by adjusting the first voltage control signal PVCON0~PVCON3. For example, each bit of the first voltage control signal PVCON0~PVCON3 is logic low in case of normal operation mode.

When the first bit PVCON is logic high and the rest of the bits PVCON1~PVCON3 are logic low of the first voltage control signal PVCON0~PVCON3, the resistor R11 is disabled because the MNOS transistor MN11 is turned on. Therefore, target pumping level of the first voltage VP is reduced. When first bit PVCON0 and the second bit PVCON1 is logic high and rest bits PVCON2~PVCON3 are logic low of the first voltage control signal PVCON0~PVCON3, the resistor R11 and the resistor R12 are disabled because the MNOS transistors MN11 and MN12 are turned on. Therefore, target pumping level of the first voltage VP is more reduced. The offsets of the write data may be compensated for by turning on/off the NMOS transistors MN11, MN12, MN13 and MN14 according to each bit of the first voltage control signal PVCON0~PVCON3.

Figure 9:
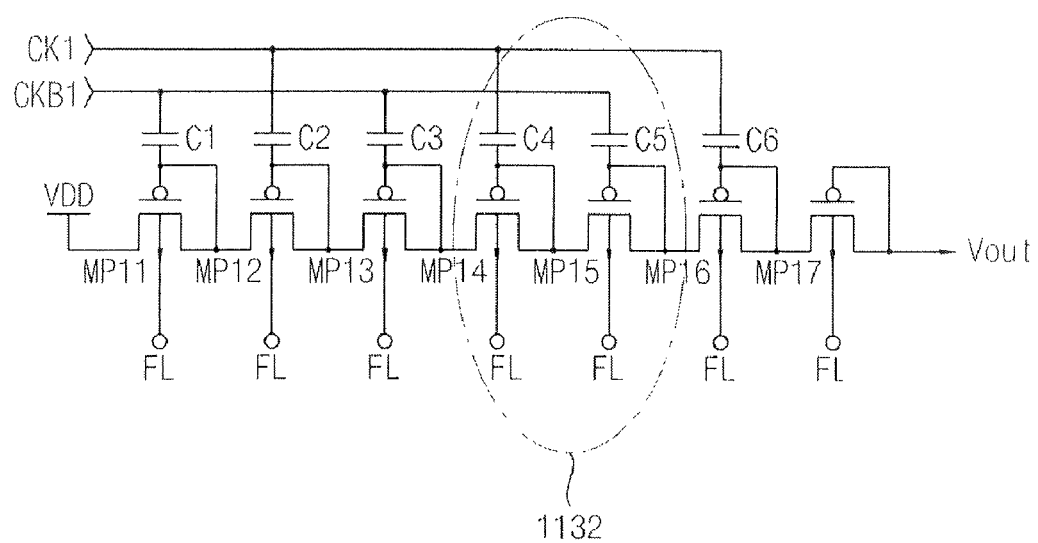
FIG. 9 is a circuit diagram illustrating an example of the first pumping circuit in the first voltage generating circuit of FIG. 8.

Referring now to FIG. 9, a circuit diagram illustrating an example of the first pumping circuit in the first voltage generating circuit of FIG. 8 will be discussed. As illustrated in FIG. 9, the first pumping circuit 1131 includes cascaded-connected PMOS transistors MP11, MP12, MP13, MP14, MP15, MP16 and MP17. Each of the PMOS transistors MP11, MP12, MP13, MP14, MP15, MP16 and MP17 is diode-connected. Each first terminal of capacitors C1-C6 is connected to each gate of the PMOS transistors MP11, MP12, MP13, MP14, MP15 and MP16. A capacitor is not connected to the PMOS transistor MP17. Each second terminal of the capacitors C1, C3 and C5 receives the clock signal CKB1, and each second terminal of the capacitors C2, C4 and C6 receives the clock signal CK1.

Power supply voltage VDD is applied to a source of the PMOS transistor MP11, an output voltage VOUT is provided at a drain of the PMOS transistor MP17. Each body of the PMOS transistors MP11, MP12, MP13, MP14, MP15, MP16 and MP17 is floated. The output voltage VOUT in FIG. 9 corresponds to the first voltage VP in FIG. 8.

Figure 10:
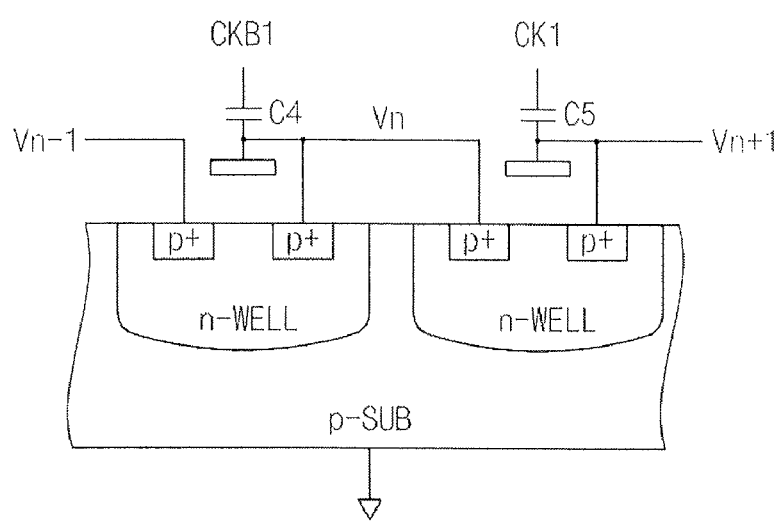
FIG. 10 is a cross-sectional diagram illustrating some part of the first pumping circuit of FIG. 9.

Referring now to FIG. 10, a cross-sectional diagram illustrating some part of the first pumping circuit of FIG. 9 when the first pumping circuit is implemented into a semiconductor integrated circuit will be discussed. As illustrated in FIG. 10, the PMOS transistors MP14 and MP15 and capacitors C4 and C5 are illustrated as reference numeral 1132 indicates.

As further illustrated in FIG. 10, each of the PMOS transistors MP14 and MP15 includes a n-type well n-WELL formed in a p-type substrate p-SUB and a p-type source region and a p-type drain region formed in n-type well n-WELL. The n-type wells n-WELL, forming a body of each of the PMOS transistors MP14 and MP15, are all floated. $V(n-1)$, $V(n)$ and $V(n+1)$ denotes voltages of source and drain of the PMOS transistors MP14 and MP15.

Figure 11:
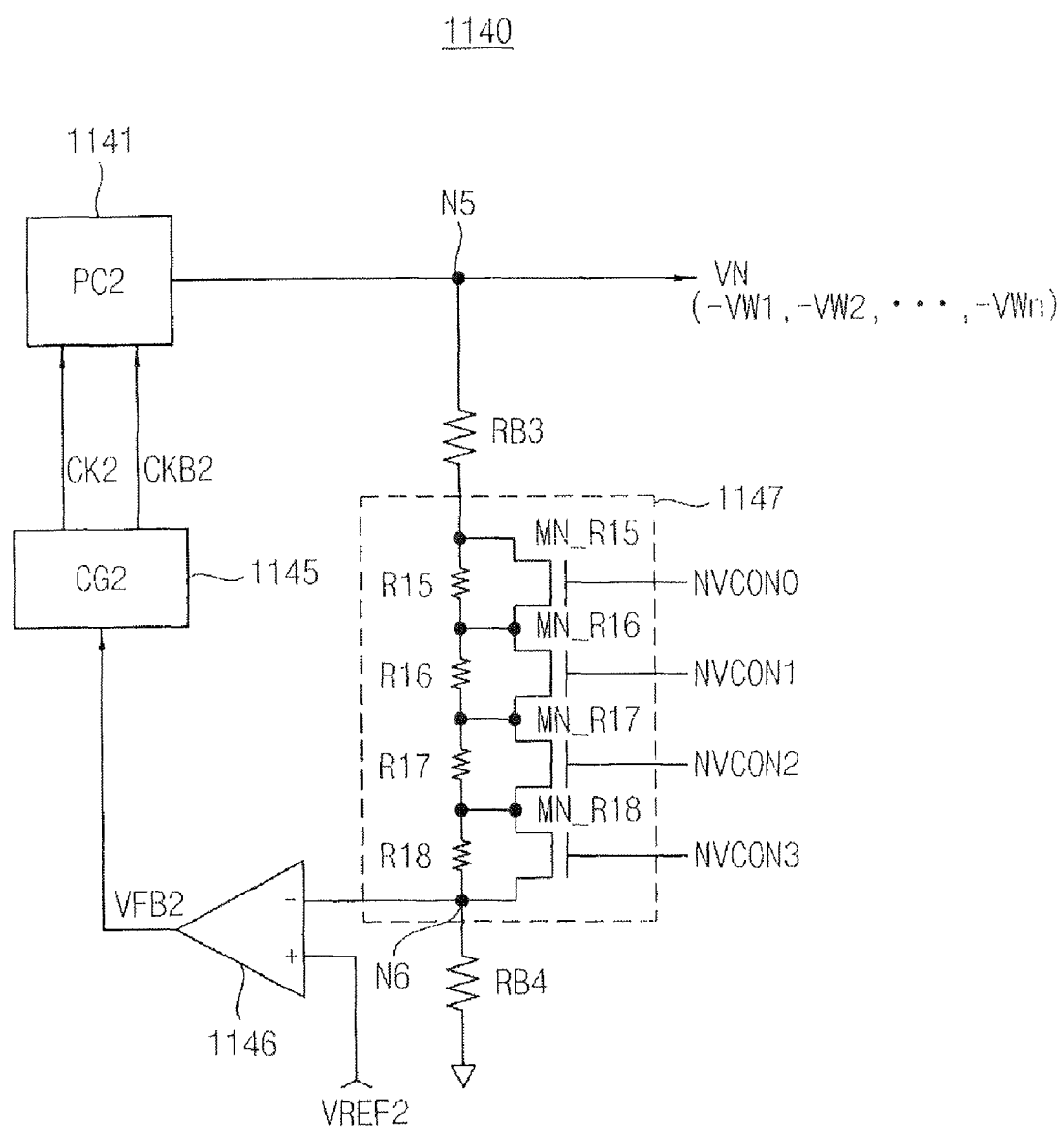
FIG. 11 is a circuit diagram illustrating an example of a second voltage generating circuit in the I/O circuit of FIG. 6.

Referring now to FIG. 11, a circuit diagram illustrating an example of a second voltage generating circuit in the I/O circuit of FIG. 6 will be discussed. As illustrated in FIG. 11, a second voltage generating circuit 1140 includes a second pumping circuit (PC2) 1141, a second clock generator (CG2) 1145, a second comparator 1146, reference resistors RB3 and RB4, a second resistance adjusting unit 1147. The second resistance adjusting unit 1147 includes resistors R15, R16, R17, and R18 and NMOS transistors MN15, MN16, MN17, and MN18. Each of the NMOS transistors MN15, MN16, MN17, and MN18 is connected in parallel to each of the resistors R15, R16, R17, and R18.

The reference resistor RB3 has a first terminal coupled to a node N5. The second resistance adjusting unit 1147 is connected between a second terminal of the resistor RB3 and a node N6, the reference resistor RB4 is connected between the node N6 and the ground.

The second comparator 1146 has a first (inverting) input terminal connected to the node N6 and a second (non-inverting) input terminal receiving a second reference voltage VREF2, and outputs a second feedback voltage VFB2. The second clock generator 1145 generates clock signals CK2 and CKB2 in response to the second feedback voltage VFB2. The phase difference of the clock signals CK2 and CKB2 is substantially 180°. The second pumping circuit 1141 performs a pumping operation in response to the clock signals CK2 and CKB2, generates the second voltage VN and provides the second voltage VP to the node N5. The second resistance adjusting unit 1147 adjusts resistance and the magnitude of the second voltage VN in response to the second voltage control signal (NVCON0~NVCON3).

Operations of the second voltage generating circuit of FIG. 11 will now be discussed. The second feedback voltage VFB2, output of the second comparator 1146, becomes logic high, when the absolute magnitude of the second voltage VP on the node N3 decreases. The second clock generator 1145 generates the clock signals CK2 and CKB2 in response to the second feedback voltage VFB2, and provides the clock signals CK2 and CKB2 to the second pumping circuit 1141. The second pumping circuit 1141 performs a pumping operation in response to the clock signals CK2 and CKB2, and increases the absolute magnitude of the second voltage VN.

The second feedback voltage VFB2, output of the second comparator 1146, becomes logic low, when the absolute magnitude of the second voltage VN on the node N5 increases. The second clock generator 1145 disables clock signals CK2 and CKB2 in response to the second feedback voltage VFB2. Therefore, the absolute magnitude of the second voltage VN does not increase because the second pumping circuit 1141 does not perform pumping operation.

When the write data has offsets, the absolute magnitude of the second voltage VN is adjusted by adjusting the second voltage control signal NVCON0~NVCON3. For example, each bit of the second voltage control signal NVCON0~NVCON3 is logic low in case of normal operation mode.

When first bit NVCON is logic high and rest bits NVCON1~NVCON3 are logic low of the second voltage control signal NVCON0~NVCON3, the resistor R15 is disabled because the MNOS transistor MN15 is turned on. Therefore, target absolute pumping level of the second voltage VN is reduced. When first bit NVCON0 and the second bit NVCON1 is logic high and rest bits NVCON2~NVCON3 are logic low of the second voltage control signal NVCON0~NVCON3, the resistor R15 and the resistor R15 are disabled because the MNOS transistors MN15 and MN15 are turned on. Therefore, target absolute pumping level of the second voltage VN is more reduced. The offsets of the write data may be compensated for by turning on/off the NMOS transistors MN15, MN16, MN17 and MN18 according to each bit of the second voltage control signal NVCON0~NVCON3.

Figure 12:
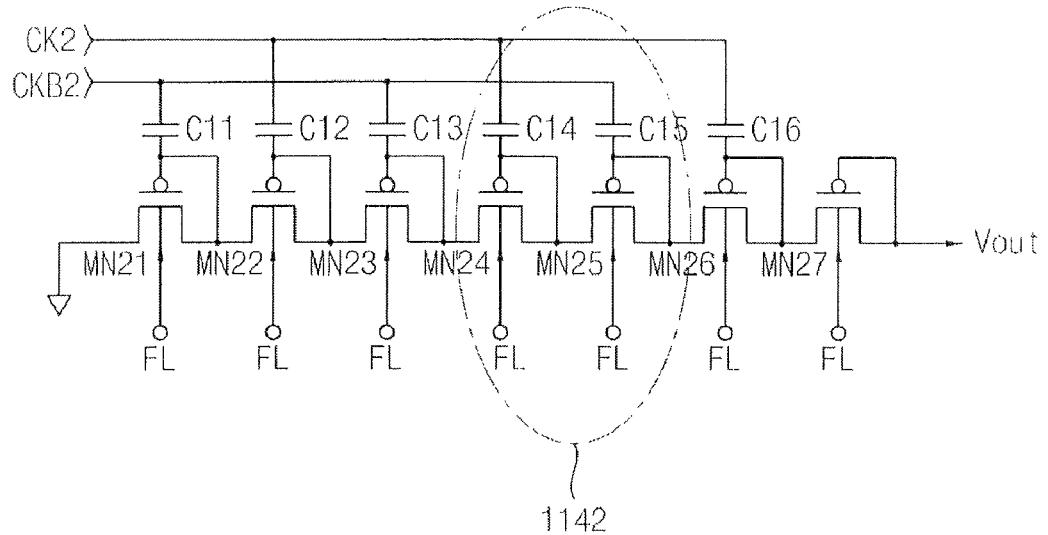
FIG. 12 is a circuit diagram illustrating an example of the second pumping circuit in the second voltage generating circuit of FIG. 11.

Referring now to FIG. 12, a circuit diagram illustrating an example of the second pumping circuit in the second voltage generating circuit of FIG. 11 will be discussed. As illustrated in FIG. 11, the second pumping circuit 1141 includes cascaded-connected NMOS transistors MN21, MN22, MN23, MN24, MN25, MN26 and MN27. Each of the NMOS transistors MN21, MN22, MN23, MN24, MN25, MN26 and MN27 is diode-connected. Each first terminal of capacitors C11-C16 is connected to each gate of the NMOS transistors MN21, MN22, MN23, MN24, MN25 and MN26. Capacitor is not connected to the NMOS transistor MN27. Each second terminal of the capacitors C11, C13 and C15 receives the clock signal CKB2, and each second terminal of the capacitors C12, C14 and C16 receives the clock signal CK2.

Ground voltage is applied to a source of the NMOS transistor MN21, an output voltage VOUT is provided at a drain of the NMOS transistor MN27. Each body of the NMOS transistors MN21, MN22, MN23, MN24, MN25, MN26 and MN27 is floated. The output voltage VOUT in FIG. 12 corresponds to the second voltage VN in FIG. 11.

Figure 13:
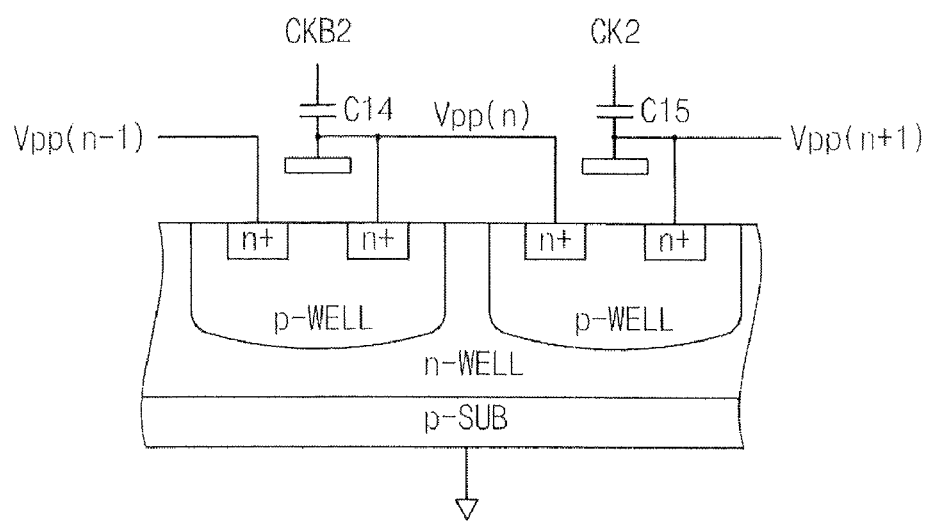
FIG. 13 is a cross-sectional diagram illustrating some part of the second pumping circuit of FIG. 12.

Referring now to FIG. 13, a cross-sectional diagram illustrating some part of the second pumping circuit of FIG. 12 when the second pumping circuit is implemented into a semiconductor integrated circuit will be discussed. As illustrated in FIG. 13, the NMOS transistors MN24 and MN25 and capacitors C14 and C15 are illustrated as reference numeral 1142 indicates.

As further illustrated in FIG. 13, each of the NMOS transistors MN24 and MN25 includes a n-type well n-WELL formed in a p-type substrate p-SUB and a p-type well p-WELL formed in the n-type well n-WELL a n-type source region and a n-type drain region formed in the p-type well p-WELL. The p-type well p-WELL, forming a body of each of the NMOS transistors MN24 and MN25, are all floated. Vpp(n−1), Vpp(n) and Vpp(n+1) denotes voltages of source and drain of the NMOS transistors MN14 and MN15.

Figure 14:
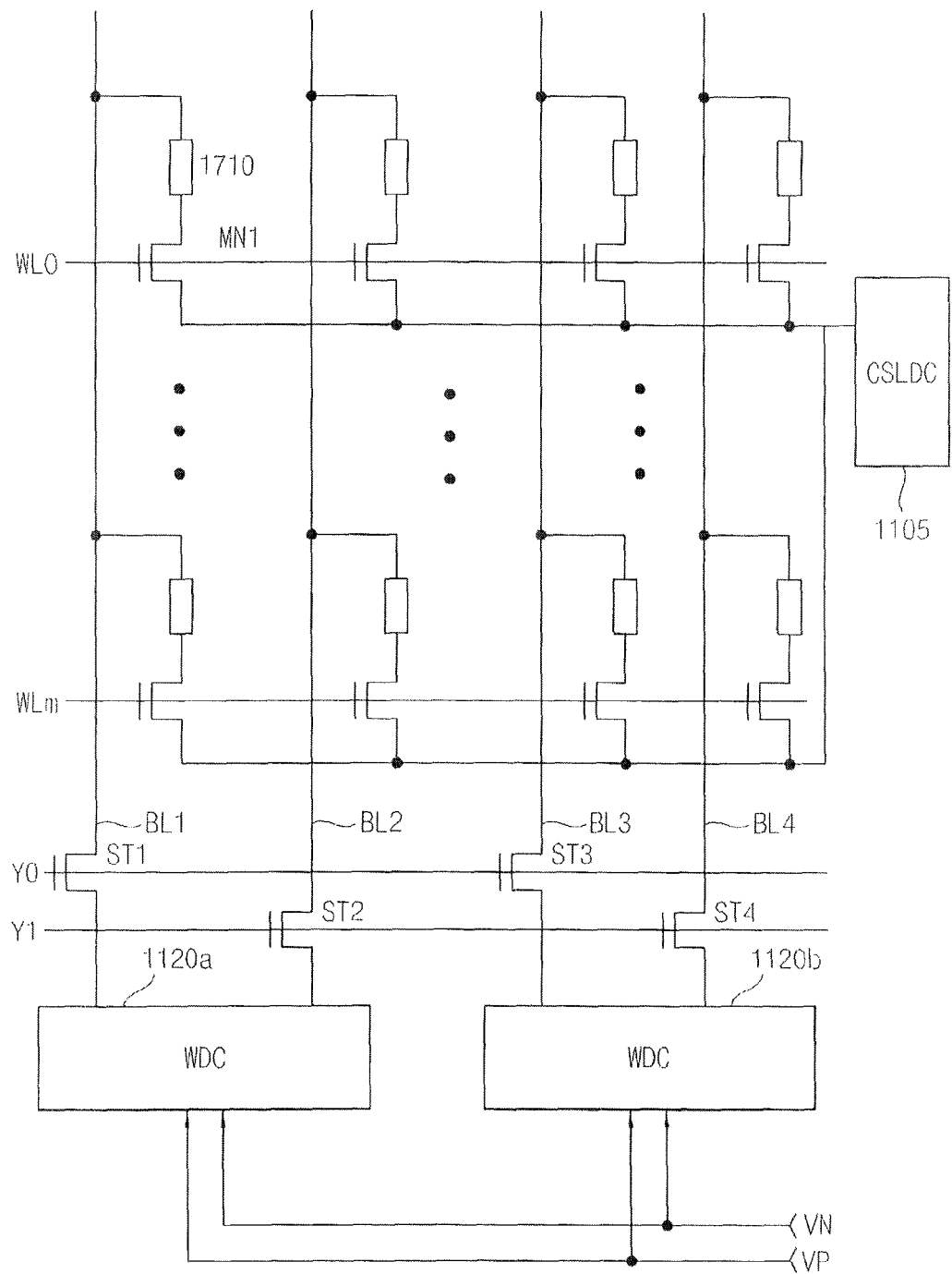
FIG. 14 is a circuit diagram illustrating the memory cell array in FIG. 1 altogether with a write driving circuit and a common source line driving circuit.

FIG. 14 is a circuit diagram illustrating the memory cell array in FIG. 1 altogether with a write driving circuit and a common source line driving circuit.

Referring now to FIG. 14, the memory cell array 1700 includes a plurality of resistive memory cells, and each resistive memory cell includes a variable resistive element 1710 and a wordline selection transistor MN1. Each of bitlines BL1 and BL2 is connected to a write driving circuit 1120a through column selection transistors ST1 and ST2, and each of bitlines BL3 and BL4 is connected to a write driving circuit 1120b through column selection transistors ST3 and ST4.

As illustrated in FIG. 14, the write driving circuit (WDC) 1120a drives the bitlines BL1 and BL2 which are respectively enabled in response to column selection signals Y0 and Y1, and the write driving circuit 1120b drives the bitlines BL3 and BL4 which are respectively enabled in response to column selection signals Y2 and Y3. Each of the write driving circuit 1120a and the write driving circuit 1120b may drive more than two bitlines.

In the memory cell array 1700, source of the wordline selection transistor MN1 in the each resistive memory cell is connected to the common source line driving circuit (CSLDC) 1105.

The write driving circuits 1120a and 1120b receive the first voltage VP and the second voltage VN. The write driving circuit 1120a selects one of write driving circuits 1120a and 1120b, and provides the selected one to the bitlines BL1 and BL2 through the column selection transistors ST1 and ST2. The write driving circuit 1120b selects one of write driving circuits 1120a and 1120b, and provides the selected one to the bitlines BL3 and BL4 through the column selection transistors ST3 and ST4.

In the bi-directional memory device 1000 according to some embodiments, a reference voltage having one voltage level may be applied to a common source line which is commonly connected to each source of the resistive memory cells. For example, the common source line driving circuit 1105 may apply ground voltage to the common source line which is commonly connected to each source of the resistive memory cells.

In addition, the bi-directional memory device 1000 may adjust magnitudes of the first and second voltages VP and VN when write data have offsets. The bi-directional resistive memory device 1000 may compensate for offsets of the write data such that the input data matches with the output data by adjusting the magnitudes of the first and second voltages VP and VN.

Figure 15:
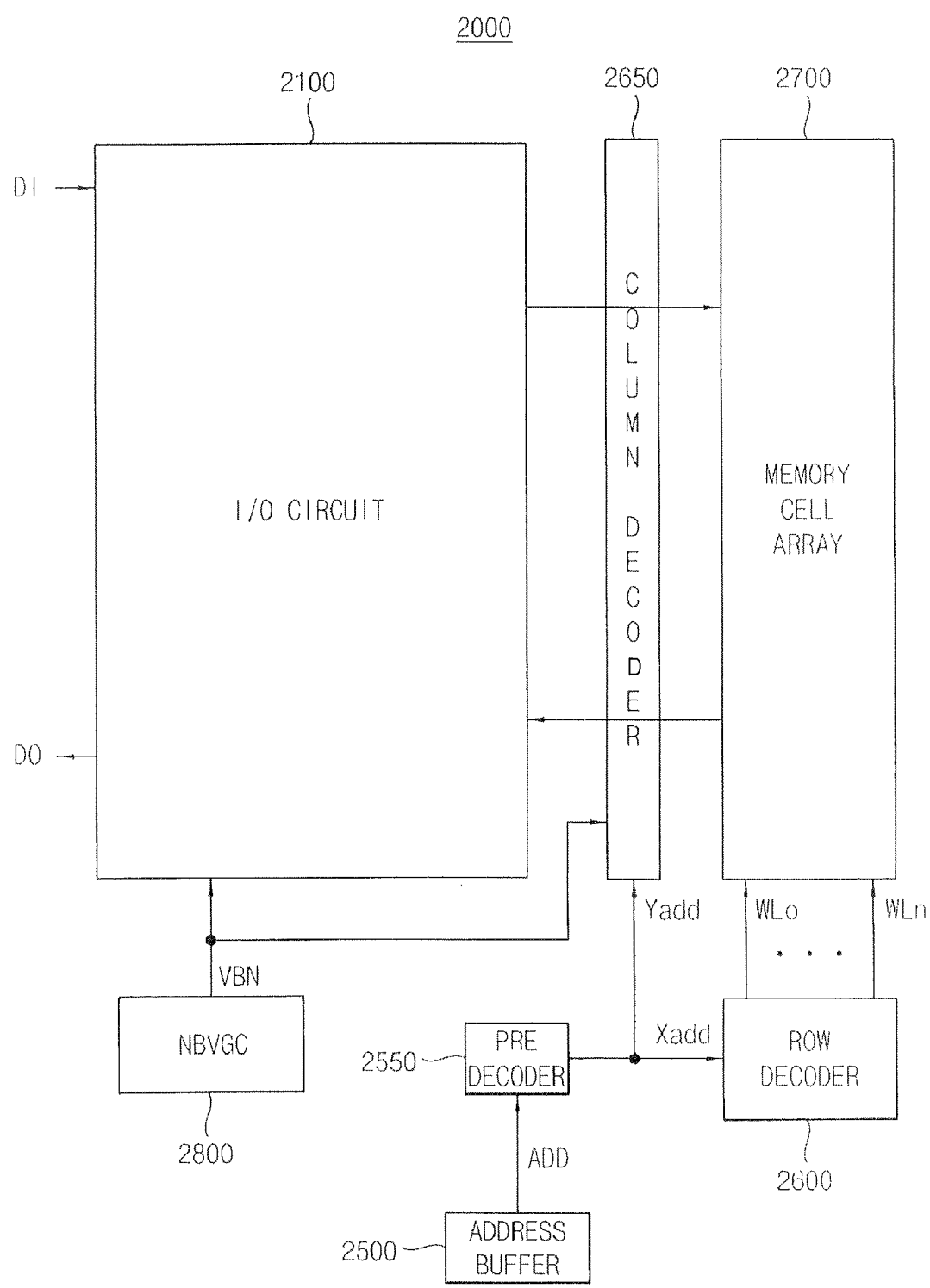
FIG. 15 is a block diagram illustrating a bi-directional memory device according to some embodiments.

Referring now to FIG. 15, a block diagram illustrating a bi-directional memory device according to some embodiments will be discussed. As illustrated in FIG. 15, a bi-directional memory device 2100 includes an input/output (I/O) circuit 2100, a resistive memory cell array (or memory cell array) 2700 and a negative bias voltage generating circuit 2800.

The I/O circuit 2100 generates a first voltage having a positive polarity and a second voltage having a negative polarity. The I/O circuit 2100 selects and provides one of the first voltage and the second voltage to the resistive memory cell array 2700 according to the logic level of input data DI. In addition, the I/O circuit 2100 adjusts magnitudes of the first and second voltage when write data in the resistive memory cell array 2700 has an offset. In addition, the I/O circuit 2100 outputs data stored in the resistive memory cell array 2700.

The negative bias voltage generating circuit 2800 generates a negative bias voltage VBN and provides the negative bias voltage VBN to the I/O circuit 2100 and a column decoder 2650. The negative bias voltage VBN is used as a bias for bodies of the I/O circuit 2100 and the column decoder 2650, i.e., a bias for p-type well of the I/O circuit 2100 and the column decoder 2650. The negative bias voltage VBN may be used as a bias in the circuit blocks which require the negative bias voltage VBN in the bi-directional memory device 2100.

The bi-directional memory device 2000 may further include an address buffer 2500, a pre-decoder 2550, a row decoder 2600 and a column decoder 2650. The pre-decoder 2550 generates a row address Xadd and a column address Yadd based on an address signal ADD from the address buffer 2500. The row decoder 2600 generates wordline driving signals WL0 through WLn based on the row address Xadd for selecting a row of memory cells in the resistive memory cell array 2700. The column decoder 2650 decodes column address Yadd and designates a bitline coupled to the memory cell, for performing the write operation or the read operation.

Figure 16:
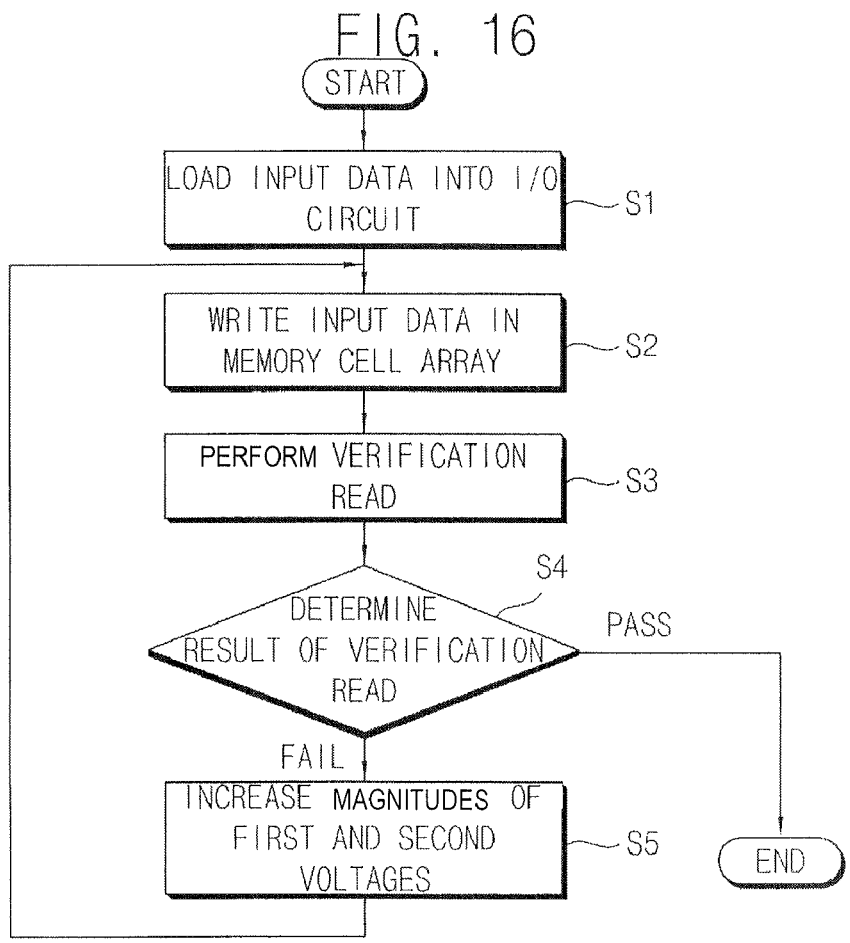
FIGS. 16 to 18 are flowcharts illustrating methods of writing data of a bi-directional resistive memory device according to some embodiments.
Figure 17:
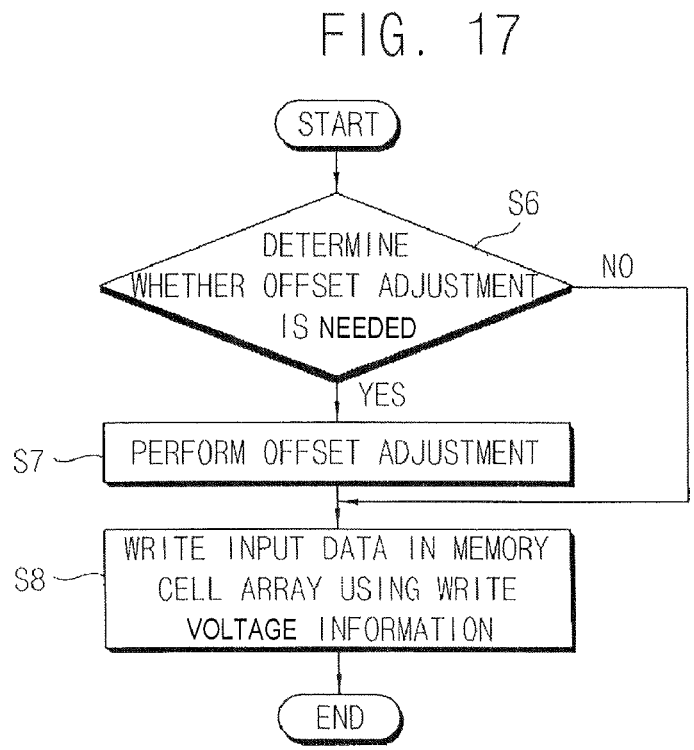
Figure 18:
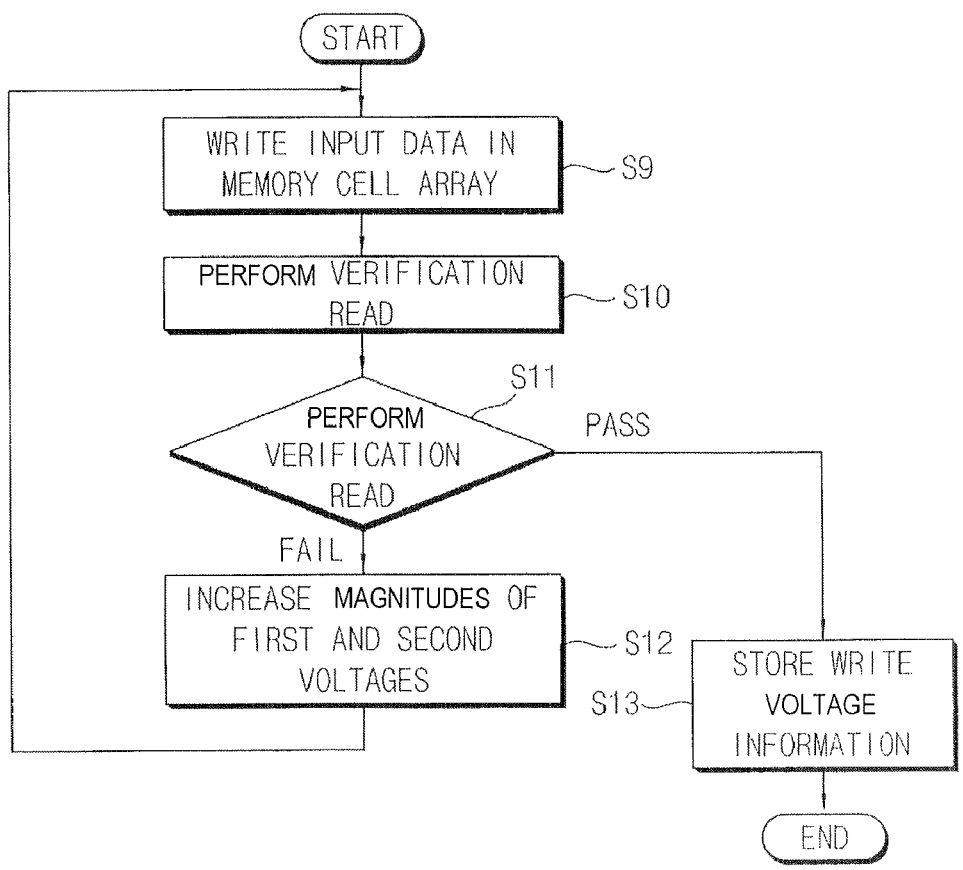

FIGS. 16 to 18 are flowcharts illustrating methods of writing data of a bi-directional resistive memory device according to some embodiments. FIG. 16 is a flow chart illustrating a method of writing data in a bi-directional resistive memory device according to some embodiments. Referring first to FIGS. 1, 6 and 16, in a method of writing data in a bi-directional resistive memory device including an input/output (I/O) circuit 1100 and a memory cell array 1700, input data DI is loaded into the I/O circuit 1100 (Step S1). Input data DI is written in the memory cell array 1700 (step S2) based on the initially-set first and second voltage (V+ and V−). Verification read operation is performed on the data (written data) written in the memory cell array 1700 (step S3). As a result of the verification read operation is determined whether the input data DI matches with the write data in the I/O circuit 1100 (Step S4). A write operation is completed when the input data DI matches with the write data (PASS) based on the result of the verification read operation (step S5). Step (S2) is performed while increasing magnitudes of the first voltage and the second voltage +Vn+1 and −Vn+1 in the I/O circuit 1100 when the input data DI does not match with the write data (FAIL) based on the result of the verification read operation (Step S6). Steps (S2~S5) are repeatedly performed until the input data DI matches with the write data.

Referring now to FIG. 17, a flow chart illustrating a method of writing data in a bidirectional resistive memory device according to some embodiments will be discussed. Referring to FIGS. 15 and 17, in a method of writing data in a bi-directional resistive memory device 2000 including an I/O circuit 2100, a memory cell array 2700 and a negative bias voltage generating circuit 2800, whether offset adjustment of the write data is needed is determined in the I/O circuit 2100 (Step S6). When the bi-directional resistive memory device 2000 is powered on, whether offset adjustment of write data is needed may be determined in the I/O circuit 2100. When the offset adjustment of write data is needed, the adjustable first and second voltages VP and VN are generated and the first and second voltage VP and VN are adjusted as required using the negative bias voltage generating circuit 2800 (Step S7). Input data DI is written in the memory cell array 2700 (Step S8). When the offset adjustment of the write data is not needed, input data DI is written in the memory cell array 2700 using write voltage information in the I/O circuit (Step S8) while not performing the step (S7).

Referring now to FIG. 18, a flow chart illustrating the step of offset adjustment of write data in FIG. 17 in detail will be discussed. As illustrated in FIG. 18, in the step of offset adjustment of write data (Step S7), input data DI is written in the memory cell array 2700 (Step S9) based on the initially-set first and second voltage (V+ and V−). A verification read operation is performed on the data (written data) written in the memory cell array 2700 (Step S10). Result of the verification read operation is determined whether the input data DI matches with the write data in the I/O circuit 1100 (Step S11).

A write operation is completed while storing write voltage information, i.e., information of the first and second voltages, when the input data DI matches with the write data (PASS) based on the result of the verification read operation (Step S13). Step (S2) is performed while increasing magnitudes of the first voltage and the second voltage +Vn+1 and −Vn+1 in the I/O circuit 2100 when the input data DI does not match with the write data (FAIL) based on the result of the verification read operation (Step S12). Steps (S8~S11) are repeatedly performed until the input data DI matches with the write data.

Figure 19:
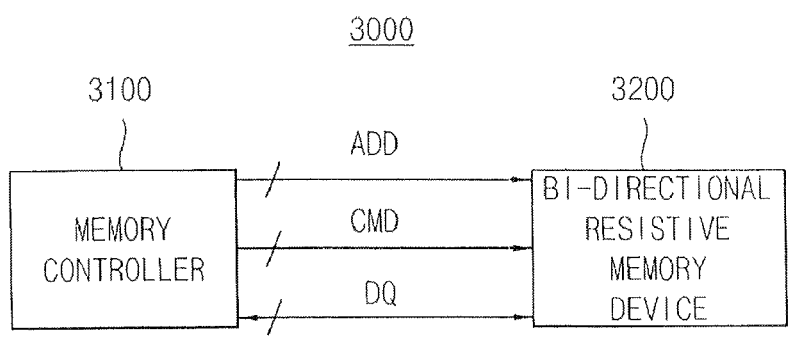
FIG. 19 is a block diagram illustrating a memory system including a bi-directional resistive memory device according to some embodiments.

Referring now to FIG. 19, a block diagram illustrating a memory system including a bi-directional resistive memory device according to some embodiments will be discussed. As illustrated in FIG. 19, a memory system 3000 includes a memory controller 3100 and a bi-directional resistive memory device 3200.

The memory controller 3100 generates an address signal ADD and command signals CMD, and provides the address signal ADD and the command signals CMD to the bi-directional resistive memory device 3200 through a bus. Data DQ indicates input data to be written into memory cells in the bi-directional resistive memory device 3200, or output data read from the memory cells in the bi-directional resistive memory device 3200.

The bi-directional resistive memory device 3200 may have a configuration described with reference to FIGS. 1 through 19. The resistive memory device 3200 stores and outputs the data DQ in response to the address signal ADD and the command signals CMD. The bi-directional resistive memory device 3200 may include an input/output (I/O) circuit and a resistive memory cell array (or memory cell array) as illustrated in FIG. 1. The resistive memory cell array includes a plurality of memory cells, and each of memory cells is coupled to a corresponding bitline. The I/O circuit generates a first voltage having a positive polarity and a second voltage having a negative polarity. The I/O circuit selects and provides one of the first voltage and the second voltage to the resistive memory cell array according to logic level of input data DI. In addition, the I/O circuit adjusts magnitudes of the first and second voltage when write data in the resistive memory cell array has an offset.

As described above, the bi-directional resistive memory device according to some embodiments may compensate for offsets of the write data by adjusting the magnitude of the first and second voltage. Accordingly, the bi-directional resistive memory device according to some embodiments may be employed in a resistive memory device such as PRAM and RRAM and a memory system having the resistive memory device.

The foregoing is illustrative of some embodiments and is not to be construed as limiting thereof. Although some embodiments have been described, those skilled in the art will readily appreciate that many modifications are possible in some embodiments without materially departing from the novel teachings and advantages of the present inventive concept. Accordingly, all such modifications are intended to be included within the scope of the present inventive concept as defined in the claims. Therefore, it is to be understood that the foregoing is illustrative of some embodiments and is not to be construed as limited to the specific embodiments disclosed, and that modifications to the disclosed embodiments, as well as other embodiments, are intended to be included within the scope of the appended claims.

What is claimed is:

1. A bi-directional resistive memory device comprising:
   a memory cell array including a plurality of memory cells; and an input/output (I/O) circuit configured to generate a first voltage having a positive polarity and a second voltage having a negative polarity, the I/O circuit being further configured to provide one of the first voltage and the second voltage to the memory cell array through a bitline responsive to a logic state of input data, and to adjust magnitudes of the first and second voltage when write data written in the memory cell array has an offset.

2. The device of claim 1, wherein sources of the plurality of memory cells are commonly coupled to a common source line and wherein a reference voltage having a single voltage level is applied to the common source line.

3. The device of claim 2, wherein a ground voltage is applied to the common source line.

4. The device of claim 1, wherein each of the plurality of memory cells includes a variable resistive element, wherein the variable resistive element is a bipolar element having a conducting current and a corresponding resistance when a voltage applied to two terminals of the variable resistive element has a positive polarity and a negative polarity.

5. The device of claim 4, wherein the variable resistive element includes a first element including non-ohmic material and a second element including resistive material connected, the first and second elements being connected in series.

6. The device of claim 5, wherein the resistive material comprises at least one of phase change material, transition-metal oxide and ferromagnetism material.

7. The device of claim 1, wherein the I/O circuit comprises:
an input circuit that is configured to provide the first voltage or the second voltage to a selected bitline coupled to the memory cell array in a write operation mode, and adjust the magnitudes of the first and second voltage when the write data has an offset; and
an output circuit configured to sense data stored in the memory cell array through the selected bitline, latch the sensed data and output the latched data in a verification read operation mode, or a read operation mode.

8. The device of claim 7, wherein the input circuit comprises:
a first voltage generating circuit configured to generate the first voltage in response to a first voltage control signal;
a second voltage generating circuit configured to generate the second voltage in response to a second voltage control signal; and
a write driving circuit configured to receive the input data, select one of the first voltage corresponding to a first data of the input data and the second voltage corresponding a second data of the input data, and provide the selected one to the memory cell array through the bitline BL in a write operation mode.

9. The device of claim 8, wherein the input circuit further comprises:
a first register configured to output the first voltage control signal; and
a second register configured to output the second voltage control signal.

10. The device of claim 8, wherein the first and second voltages are generated based on verification read operation when the write data has an offset.

11. The device of claim 8, wherein the write driving circuit comprises:

an input buffer configured to latch and buffer the input data; and
a driving unit configured to output one of the first and second voltages to the bitline through selection transistors in response to an output signal of the input buffer.

12. The device of claim 8, wherein the first voltage generating circuit comprises:
a resistance adjusting unit connected between first and second nodes and configured to adjust the first voltage on the first node in response to the first voltage control signal;
a comparator having a first input terminal connected to the second node and a second input terminal configured to receive a reference voltage, and configured to output a feedback voltage;
a clock generator configured to generate first and second clock signals whose phase difference is substantially 180° responsive to the feedback voltage; and
a pumping circuit configured to perform a pumping operation, generate the first voltage and provide the first voltage to the first node responsive to the first and second clock signals.

13. The device of claim 12, wherein the resistance adjusting unit is configured to adjust the magnitude of the first voltage on the first node by varying resistance in response to the first voltage control signal.

14. The device of claim 8, wherein the second voltage generating circuit comprises:
a resistance adjusting unit connected between first and second nodes and configured to adjust the second voltage on the first node in response to the second voltage control signal;
a comparator having a first input terminal connected to the second node and a second input terminal configured to receive a reference voltage, and configured to output a feedback voltage;
a clock generator configured to generate first and second clock signals whose phase difference is substantially 180° responsive to the feedback voltage; and
a pumping circuit configured to perform a pumping operation, generate the second voltage and provide the second voltage to the first node responsive to the first and second clock signals.

15. The device of claim 1, further comprising a negative bias voltage generating circuit configured to generate a negative bias voltage and provide the negative bias voltage as a bias for the I/O circuit.

16. A memory system comprising:
a memory controller configured to generate an address signal and command signals; and
a bi-directional resistive memory device configured to store data and output the stored data based on the address signal and command signals, the bi-directional resistive memory device comprising:
a memory cell array including a plurality of memory cells; and
an input/output (I/O) circuit configured to generate a first voltage having a positive polarity and a second voltage having a negative polarity, the I/O circuit being configured to provide one the first voltage and the second voltage to the memory cell array through a bitline responsive to a logic state of input data, and configured to adjust magnitudes of the first and second voltage when data written in the memory cell array has an offset.

17. A method of writing data in a bi-directional resistive memory device including an input/output (I/O) circuit and a memory cell array, the method comprising:
loading input data to the I/O circuit;
writing the input data into the memory cell array;
performing a verification read operation on the write data written in the memory cell array in the I/O circuit;
determining whether the input data matches with the write data based on a result of the verification read operation in the I/O circuit;
finishing writing input data when the input data matches with the write data in the I/O circuit; and
increasing magnitudes of first and second voltages while writing input data in the memory cell array in the I/O circuit when the input data does not match with the write data.

18. The method of claim 17, wherein performing, determining and finishing are repeatedly performed until the input data matches with the write data when the input data does not with the write data.

* * * * *